US011450515B2

(12) United States Patent
Nagaseki et al.

(10) Patent No.: US 11,450,515 B2
(45) Date of Patent: *Sep. 20, 2022

(54) PLASMA PROCESSING APPARATUS

(71) Applicant: TOKYO ELECTRON LIMITED, Tokyo (JP)

(72) Inventors: Kazuya Nagaseki, Miyagi (JP); Shinji Himori, Miyagi (JP); Mitsunori Ohata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/030,522

(22) Filed: Sep. 24, 2020

(65) Prior Publication Data

US 2021/0013015 A1 Jan. 14, 2021

Related U.S. Application Data

(63) Continuation of application No. 15/840,636, filed on Dec. 13, 2017, now Pat. No. 10,825,663.

(30) Foreign Application Priority Data

Dec. 15, 2016 (JP) .............................. JP2016-243451

(51) Int. Cl.
*H01J 37/32* (2006.01)
*H01L 21/67* (2006.01)

(52) U.S. Cl.
CPC ..... *H01J 37/32669* (2013.01); *H01J 37/3211* (2013.01); *H01J 37/32688* (2013.01);
(Continued)

(58) Field of Classification Search
USPC ................ 156/345.48, 345.49; 118/723 MR, 118/723 MA, 723 AN, 723 I
See application file for complete search history.

(56) References Cited

U.S. PATENT DOCUMENTS 6,514,377 B1 * 2/2003 Morimoto ......... H01J 37/32623
118/723 E
2003/0010454 A1 * 1/2003 Bailey, III ........ H01J 37/32688
156/345.49
(Continued)

FOREIGN PATENT DOCUMENTS

JP H07-106095 A 4/1995
JP H08-022979 A 1/1996
(Continued)

*Primary Examiner* — Ram N Kackar
(74) *Attorney, Agent, or Firm* — Weihrouch IP

(57) ABSTRACT

An apparatus includes a plasma processing container; a workpiece placement table disposed in the plasma processing container; a dielectric member having a facing surface that faces the workpiece placement table; an antenna provided on a surface of the dielectric member opposite to the facing surface and configured to introduce an induced electric field for plasma excitation into the plasma processing container via the dielectric member; an electromagnet group disposed along an outer circumference of the plasma processing container and configured to form a magnetic field in the plasma processing container; and a controller configured to control magnitudes of electric currents flowing through respective electromagnets of the electromagnet group differently from each other, to generate a magnetic gradient along a circumferential direction in the magnetic field that exists only in an outer circumferential space in the plasma processing container.

7 Claims, 7 Drawing Sheets

(52) U.S. Cl.
CPC .. *H01L 21/67069* (2013.01); *H01J 37/32449* (2013.01); *H01J 37/32715* (2013.01)

(56) References Cited

U.S. PATENT DOCUMENTS

2011/0232846 A1\* 9/2011 Miyata .............. H01L 21/31138
　　　　　　　　　　　　　　　　　　　　　156/345.42
2013/0220547 A1\* 8/2013 Nagase ............. H01J 37/32669
　　　　　　　　　　　　　　　　　　　　　156/345.46

FOREIGN PATENT DOCUMENTS

| | | |
|---|---|---|
| JP | H11-340202 A | 12/1999 |
| JP | 2001-077095 A | 3/2001 |
| JP | 2010-153274 A | 7/2010 |
| WO | 2016/029817 A | 3/2016 |

\* cited by examiner

PLASMA PROCESSING APPARATUS

CROSS-REFERENCE TO RELATED APPLICATIONS

This application is a continuation of U.S. patent application Ser. No. 15/840,636, filed on Dec. 13, 2017, which claims priority from Japanese Patent Application No. 2016-243451, filed on Dec. 15, 2016, all of which are incorporated herein in their entireties by reference.

TECHNICAL FIELD

Various aspects and exemplary embodiments of the present disclosure relate to a plasma processing apparatus.

BACKGROUND

There is a plasma processing apparatus using excitation of plasma by an induced electric field. Such a plasma processing apparatus is called an inductively coupled plasma processing apparatus. The inductively coupled plasma processing apparatus includes, for example, a processing container, a placing table, a dielectric member, and an antenna. The placing table is provided in the processing container and configured to place a workpiece thereon. The dielectric member is provided above the placing table. The antenna is a planar antenna provided on the dielectric member and introduces an induced electric field for plasma excitation into the processing container via the dielectric member.

In the inductively coupled plasma processing apparatus, a gas in the processing container is dissociated by the induced electric field introduced into the processing container from the antenna, so that plasma is generated. The plasma contains active species such as, for example, ions and radicals. The ions and radicals contained in the plasma reach the workpiece placed on the placing table and react with the surface of the workpiece, thereby performing a plasma processing such as, for example, etching or film formation. See, for example, Japanese Patent Laid-Open Publication No. 2010-153274.

SUMMARY

According to an aspect, the present disclosure provides a plasma processing apparatus including a processing container; a placing table provided in the processing container and configured to place a workpiece thereon; a dielectric member having a facing surface that faces the placing table; a planar antenna provided on a surface of the dielectric member opposite to the facing surface and configured to introduce an induced electric field for plasma excitation into the processing container via the dielectric member; and an electromagnet group disposed along an outer circumference of the processing container and configured to form a magnetic field for moving ions in plasma based on the induced electric field along the facing surface of the dielectric member in the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
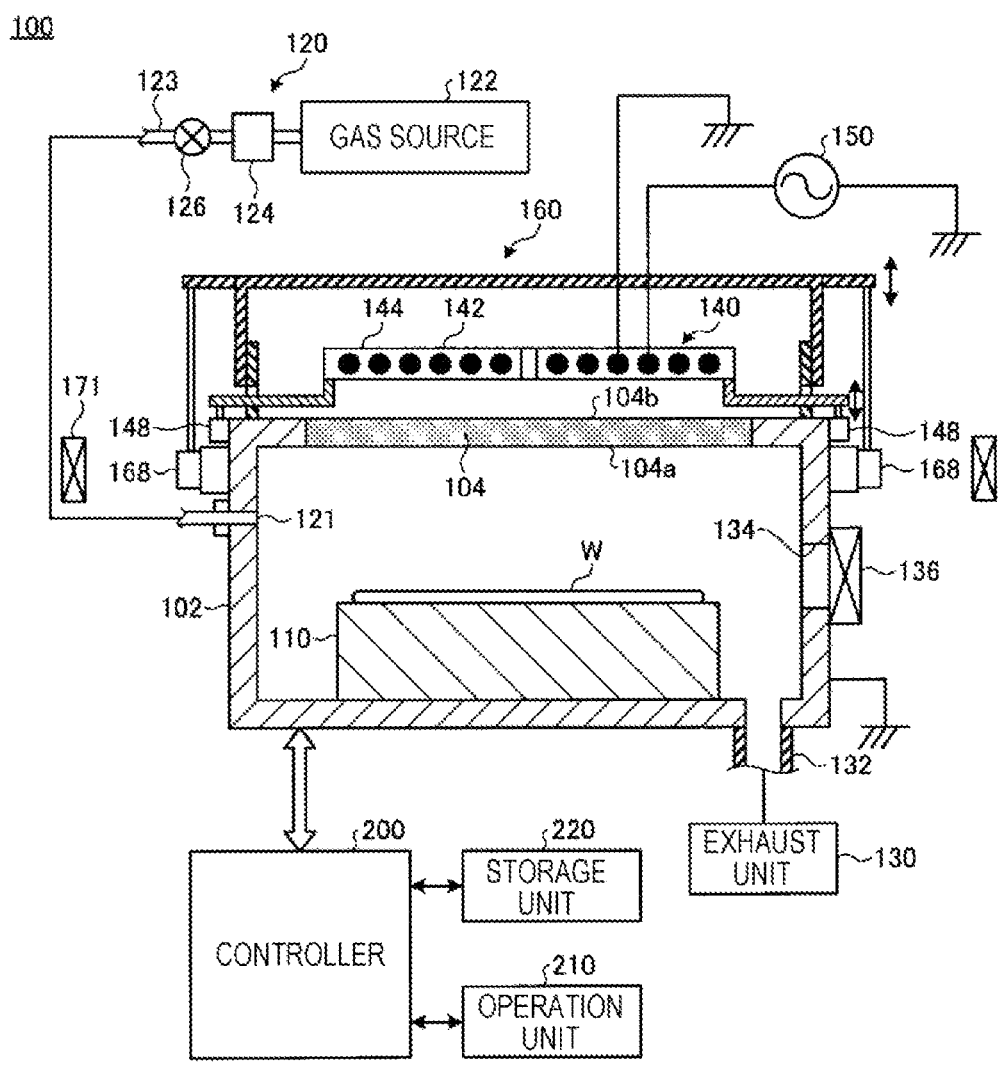
FIG. 1 is a sectional view illustrating a schematic configuration of a plasma processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the related art, it is not taken into account to appropriately control the ratio of the ions and radicals reaching the workpiece.

According to an aspect, the present disclosure provides a plasma processing apparatus including a processing container; a placing table provided in the processing container and configured to place a workpiece thereon; a dielectric member having a facing surface that faces the placing table; a planar antenna provided on a surface of the dielectric member opposite to the facing surface and configured to introduce an induced electric field for plasma excitation into the processing container via the dielectric member; and an electromagnet group disposed along an outer circumference of the processing container and configured to form a magnetic field for moving ions in plasma based on the induced electric field along the facing surface of the dielectric member in the processing container.

In the above-described plasma processing apparatus, the electromagnet group forms a magnetic field that traverses a central space in the processing container and an outer circumferential space surrounding the central space as the magnetic field.

In the above-described plasma processing apparatus, the electromagnet group forms a magnetic field that exists only in the outer circumferential space in the processing container among the central space in the processing container and the outer circumferential space surrounding the central space, as the magnetic field.

The above-described plasma processing apparatus further includes a controller that controls magnetic poles of respective electromagnets of the electromagnet group to switch the magnetic field formed by the electromagnet group to a first magnetic field that traverses the central space in the processing container and the outer circumferential space surrounding the central space, or a second magnetic field that exists only in the outer circumferential space in the processing container.

In the above-described plasma processing apparatus, the controller switches the magnetic field formed by the electromagnet group to the first magnetic field or the second magnetic field according to a switching timing of a plasma processing process executed by the plasma processing apparatus.

In the above-described plasma processing apparatus, the controller controls a magnitude of a current flowing through the electromagnets of the electromagnet group to generate a gradient in a magnetic field strength of the magnetic field formed by the electromagnet group.

The above-described plasma processing apparatus further includes a support member configured to rotatably support the electromagnet group about a central axis of the processing container. The controller controls the support member to rotate the magnetic field formed by the electromagnet group about the central axis of the processing container.

According to the aspect of the above-described plasma processing apparatus, it is possible to appropriately control the ratio of the ions and radicals reaching the workpiece.

Hereinafter, exemplary embodiments of the plasma processing apparatus disclosed herein will be described in detail with reference to drawings. Meanwhile, in the respective drawings, the same or corresponding parts will be denoted by the same symbols.

(Exemplary Configuration of Plasma Processing Apparatus)

Figure 2:
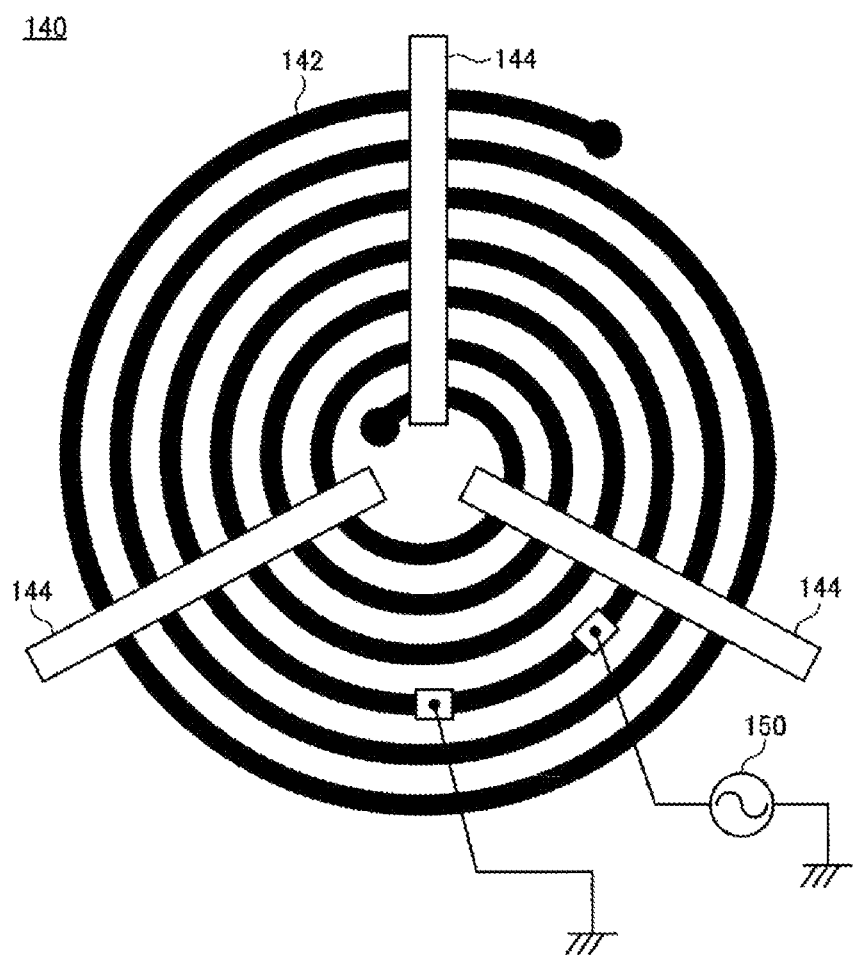
FIG. 2 is a plan view illustrating an exemplary configuration of the high frequency antenna illustrated in FIG. 1.

First, an exemplary configuration of a plasma processing apparatus 100 according to an exemplary embodiment of the present disclosure will be described with reference to the drawings. Here, an inductively coupled plasma processing apparatus will be exemplified, which performs a predetermined plasma processing on a semiconductor wafer (hereinafter, simply referred to as a "wafer") serving as a workpiece with plasma of a processing gas excited in the processing container by applying a high frequency power to a planar high frequency antenna. FIG. 1 is a sectional view illustrating a schematic configuration of a plasma processing apparatus 100 according to the exemplary embodiment. FIG. 2 is a plan view illustrating an exemplary configuration of a high frequency antenna 140 illustrated in FIG. 1.

As illustrated in FIG. 1, the plasma processing apparatus 100 includes a processing container (chamber) 102 formed of metal (e.g., aluminum) in a tubular (e.g., cylindrical) shape. The shape of the processing container 102 is not limited to the cylindrical shape. For example, the shape of the processing container 102 may be a prismatic shape (e.g., a box shape).

A placing table 110 is provided on the bottom surface of the processing container 102 to place the wafer W thereon. The placing table 110 is formed of, for example, aluminum in a substantially pillar shape (e.g., columnar shape). The shape of the placing table 110 is not limited to the columnar shape. For example, the shape of the processing container 102 may be a prismatic shape (e.g., polygonal prism). Although not illustrated, various functions (e.g., an electrostatic chuck that attracts and holds the wafer W by Coulomb force and a temperature adjustment mechanism such as, for example, a heater or a coolant flow path) may be provided on the placing table 110 as required.

On the ceiling portion of the processing container 102, a plate-like dielectric member 104 made of, for example, quartz glass or ceramic is provided to face the placing table 110. Specifically, the dielectric member 104 is formed, for example, in a disc shape and hermetically attached to close the opening formed in the ceiling portion of the processing container 102. The dielectric member 104 has a facing surface 104a that faces the processing table 110.

The processing container 102 is provided with a gas supply unit 120 that supplies, for example, a processing gas for processing the wafer W thereto. The gas supply unit 120 is configured, for example, as illustrated in FIG. 1. That is, a gas introduction port 121 is formed in the side wall portion of the processing container 102, and a gas source 122 is connected to the gas introduction port 121 via a gas supply pipe 123. A flow rate controller for controlling the flow rate of the processing gas, for example, a mass flow controller (MFC) 124 and an opening/closing valve 126 are disposed at portions of the gas supply pipe 123. With the gas supply unit 120, the processing gas from the gas supply source 122 is controlled at a predetermined flow rate by the MFC 124 and is supplied from the gas introduction port 121 into the processing container 102.

In FIG. 1, to simplify the description, the gas supply unit 120 is represented by a single gas line system. However, the gas supply unit 120 is not limited to the case of supplying the processing gas of a single gas type, and may supply a plurality of gas species as processing gases. In this case, a plurality of gas supply sources may be provided to constitute a multiple gas line system, and a mass flow controller may be provided in each gas line. In FIG. 1, the case where the gas supply unit 120 is configured to supply a gas from the side wall portion of the processing container 102 is exemplified, but the present disclosure is not limited thereto. For example, the gas may be supplied from the ceiling portion of the processing container 102. In this case, for example, a gas introduction port may be formed in, for example, the center of the dielectric member 104, and the gas may be supplied therefrom.

As a processing gas to be supplied into the processing container 102 by the gas supply unit 120, for example, a halogen-based gas containing, for example, Cl is used for etching of an oxide film. Specifically, when etching a silicon oxide film (e.g., a $SiO_2$ film), for example, $CHF_3$ gas is used as a processing gas. Further, when a high dielectric thin film (e.g., $HfO_2$, $HfSiO_2$, $ZrO_2$, or $ZrSiO_4$) is etched, $BCl_3$ gas is used as a processing gas, or a mixed gas of $BCl_3$ gas and $O_2$ gas is used as a processing gas.

An exhaust unit 130 is connected to the bottom surface of the processing container 102 via an exhaust pipe 132 to exhaust the atmosphere inside the processing container 102. The exhaust unit 130 is constituted by, for example, a vacuum pump, and is configured to reduce the pressure in the processing container 102 to a predetermined pressure. A wafer carry-in/out port 134 is formed in the side wall portion of the processing container 102, and a gate valve 136 is provided in the wafer carry-in/out port 134. For example, at the time of the carry-in of the wafer W, the gate valve 136 is opened, so that the wafer W is placed on the placing table 110 in the processing container 102 by a conveyance mechanism such as, for example, a conveyance arm (not illustrated). Then, the gate valve 136 is closed, and a processing is performed on the wafer W.

A planar high frequency antenna 140 is disposed on a surface 104b of the dielectric member 104 opposite to the facing surface 104a. The high frequency antenna 140 introduces an induced electric field for plasma excitation into the processing container 102 via the dielectric member 104. The high frequency antenna 140 is formed by holding a spiral antenna element 142 made of a conductor (e.g., copper, aluminum, or stainless steel) with a plurality of holding members 144. For example, as illustrated in FIG. 2, three holding members 144 each formed in a rod shape are disposed radially from the vicinity of the center of the antenna element 142 to the outside thereof.

The antenna element 142 is connected with a high frequency power source 150. The high frequency power source 150 supplies a high frequency power of a predetermined frequency (e.g., 27.12 MHz) to the antenna element 142. Then, an induced electric field for plasma excitation is introduced into the processing container 102 via the dielectric member 104 by the antenna element 142 supplied with the high frequency power. Then, the gas introduced into the processing container 102 is excited by the induced electric field introduced into the processing container 102 to generate plasma, and a predetermined plasma processing (e.g., an ashing processing, an etching processing, or a film forming processing) is performed on the wafer W. The high frequency power output from the high frequency power source 150 is not limited to 27.12 MHz. The high frequency power may be, for example, 13.56 MHz or 60 MHz. However, it is necessary to adjust the electrical length of the antenna element 142 depending on the high frequency power output from the high frequency power source 150.

The height of the high frequency antenna 140 may be adjusted by an actuator 148.

A substantially tubular (e.g., cylindrical) shield member 160 is provided on the ceiling portion of the processing container 102 to cover the high frequency antenna 140. The shape of the shield member 160 is not limited to the cylindrical shape. The shield member 160 may have any shape such as, for example, a prismatic shape, but the shape thereof may match the shape of the processing container 102. Here, for example, since the processing container 102 is formed in a substantially cylindrical shape, the shield member 160 is correspondingly formed in a substantially cylindrical shape. Further, when the processing container 102 has a substantially prismatic shape, the shield member 160 may also have a substantially prismatic shape. Further, the height of the high frequency antenna 160 may be adjusted by an actuator 168.

Further, on the outer circumference of the processing container 102, an electromagnet group 171 is disposed along the outer circumference of the processing container 102. The electromagnet group 171 forms a magnetic field in the processing container 102 to move ions in the plasma based on the induced electric field introduced into the processing container 102 from the high frequency antenna 140 along the facing surface 104a of the dielectric member 104. The electromagnet group 171 sets magnetic poles of the electromagnet group 171 under the control of a controller 200 (to be described later).

Figure 3:
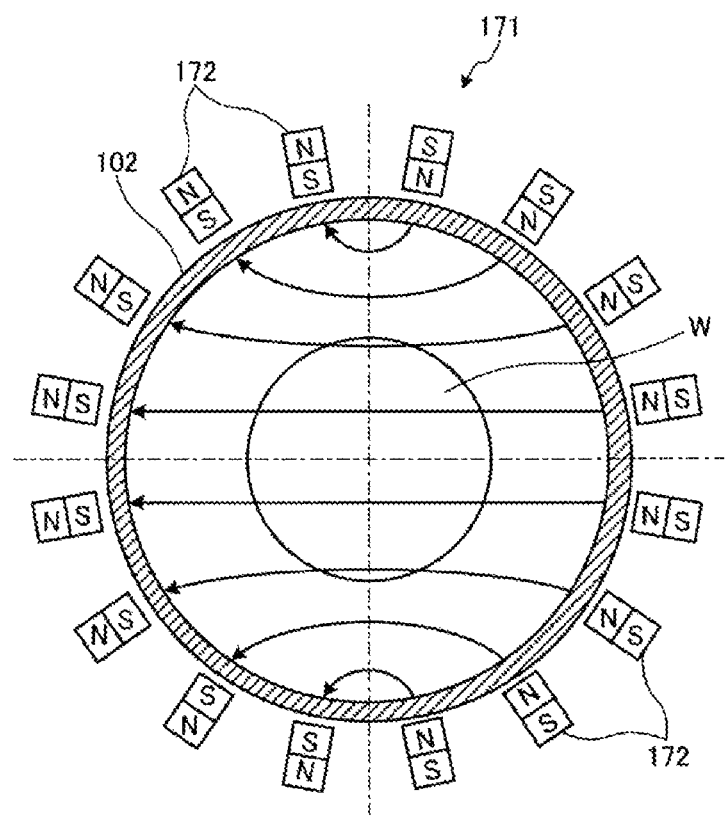
FIG. 3 is a horizontal sectional view schematically illustrating an exemplary electromagnet group arranged along the outer circumference of the processing container of the plasma processing apparatus according to the exemplary embodiment.

FIG. 3 is a horizontal sectional view schematically illustrating an example of the electromagnet group 171 arranged along the outer circumference of the processing container 102 of the plasma processing apparatus 101 according to the exemplary embodiment. As illustrated in FIG. 3, the electromagnet group 171 is configured by arranging a plurality of electromagnets 172 in a ring shape. In the example of FIG. 3, sixteen electromagnets 172 are arranged in a ring shape. In the electromagnet group 171, when receiving a "first switching control signal" from the controller 200, the magnetic poles of the respective electromagnets 172 are set such that the direction of the magnetic poles of the electromagnets 172 arranged in one section among two sections sectioned in the circumferential direction of the electromagnet group 171 and the direction of the magnetic poles of the electromagnets 172 arranged in the other section are opposite to each other. In the example of FIG. 3, the section on the left side and the section on the right side in the circumferential direction of the electromagnet group 171 are sectioned, and the direction of the magnetic poles of the eight electromagnets 172 arranged in the left section and the direction of the magnetic poles of the eight electromagnets 172 arranged in the right section are opposite to each other. The electromagnet group 171 forms a magnetic field that traverses the central space in the processing container 102 and the outer circumferential space surrounding the central space, based on the magnetic poles of the respective electromagnets 172 set as illustrated in FIG. 3. The magnetic field that traverses the central space in the processing container 102 and the outer circumferential space surrounding the central space is also called a "horizontal magnetic field." Here, the central space in the processing container 102 is, for example, a space corresponding to the region of the wafer W in the processing container 102. Further, the outer circumferential space in the processing container 102 is, for example, a space corresponding to the region surrounding the wafer W in the processing container 102.

Figure 4:
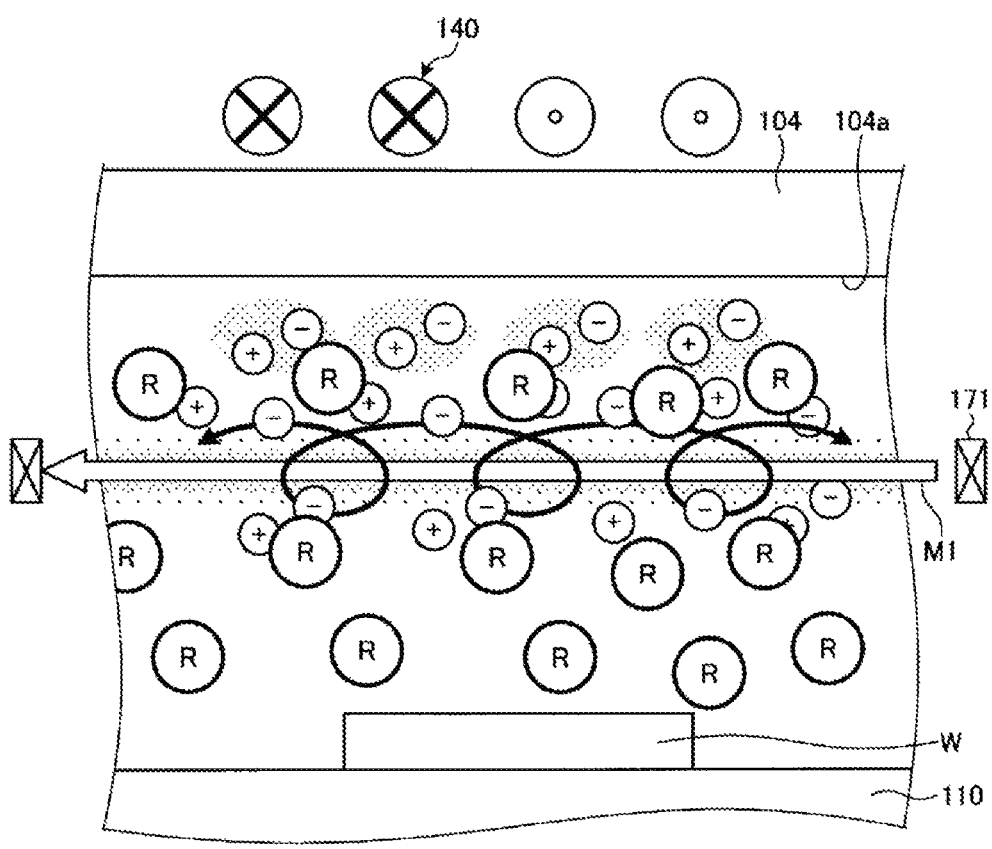
FIG. 4 is a view for explaining an action of a horizontal magnetic field formed by the electromagnet group.

FIG. 4 is a view for explaining an action of a horizontal magnetic field formed by the electromagnet group 171. When a horizontal magnetic field M1 is generated in the processing container 102 by the electromagnet group 171 in a state where plasma based on the induced electric field from the high frequency antenna 140 is generated, electrons in the plasma are wound around magnetic force lines of the horizontal magnetic field M1 and reciprocate along the magnetic force lines. In addition, since the Larmor radius decreases as the magnetic flux density increases, the electron density at the position of the height of the magnet having a high magnetic flux density increases, and the electron density around the periphery (above and below the magnet center) decreases. Further, since cations in the plasma are attracted to the electrons to maintain electric neutrality, the density in the height direction of the cations is the highest at the height of the magnet center as well. Thus, the amount of the cations reaching the wafer W is suppressed in both the central portion and the edge portion of the wafer W. Meanwhile, radicals in the electrically neutral plasma descend toward the wafer W without receiving a force from the horizontal magnetic field M1. As a result, the ratio of the ions and radicals reaching the wafer W is appropriately controlled.

Figure 5:
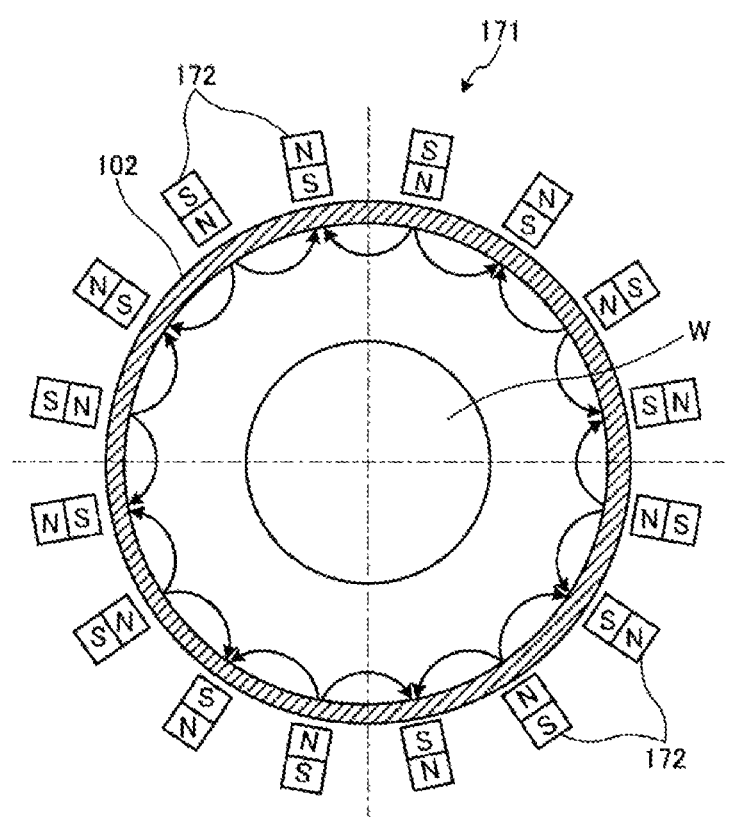
FIG. 5 is a horizontal sectional view schematically illustrating another exemplary electromagnet group arranged along the outer circumference of the processing container of the plasma processing apparatus according to the exemplary embodiment.

FIG. 5 is a horizontal sectional view schematically illustrating another example of the electromagnet group 171 arranged along the outer circumference of the processing container 102 of the plasma processing apparatus 101 according to the exemplary embodiment. As illustrated in FIG. 5, the electromagnet group 171 is configured by arranging a plurality of electromagnets 172 in a ring shape. In the example of FIG. 5, sixteen electromagnets 172 are arranged in a ring shape. In the electromagnet group 171, when receiving a "second switching control signal" from the controller 200, the magnetic poles of the respective electromagnets 172 are set such that the directions of the magnetic poles of the electromagnets 172 arranged in mutually adjacent sections among a plurality of sections sectioned in the circumferential direction of the electromagnet group 171 are opposite to each other. In the example of FIG. 5, sixteen sections are sectioned in the circumferential direction of the electromagnet group 171, and the directions of the magnetic poles of the electromagnets 172 arranged in mutually adjacent sections are opposite to each other. The electromagnet group 171 forms a magnetic field that exists only in the outer circumferential space in the processing container 102 among the central space in the processing container 102 and the outer circumferential space surrounding the central space, based on the magnetic poles of the respective electromagnets 172 set as illustrated in FIG. 5. The magnetic field that exists only in the outer circumferential space in the processing container 102 is called a "cusp magnetic field." Here, the central space in the processing container 102 is, for example, a space corresponding to the region of the wafer W in the processing container 102. Further, the outer circumferential space in the processing container 102 is, for example, a space corresponding to the region surrounding the wafer W in the processing container 102.

Figure 6:
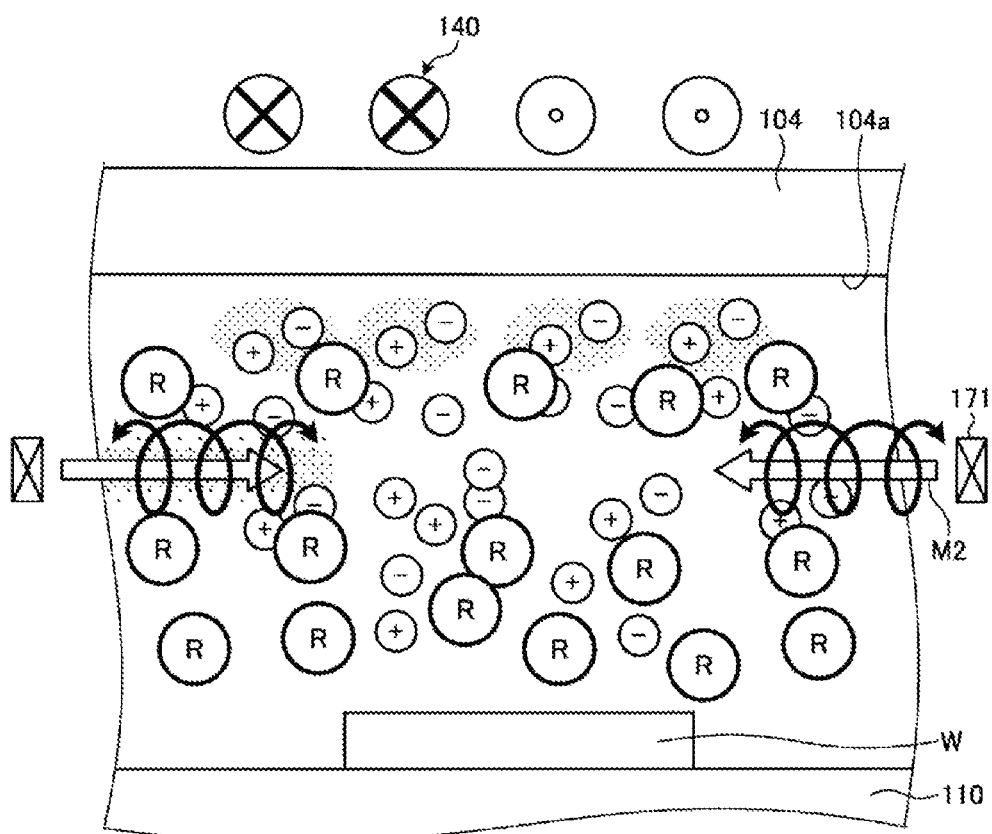
FIG. 6 is a view for explaining an action of a cusp magnetic field formed by the electromagnet group.
Figure 6:
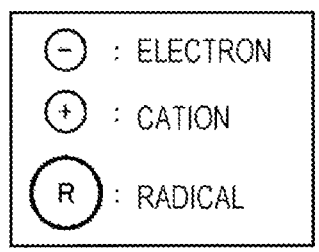

FIG. 6 is a view for explaining an action of a cusp magnetic field formed by the electromagnet group 171. When a cusp magnetic field M2 is generated in the processing container 102 by the electromagnet group 171 in a state where plasma based on the induced electric field from the high frequency antenna 140 is generated, electrons present in the outer circumferential space in the processing container 102 among the electrons in the plasma are moved along the facing surface 104a of the dielectric member 104 in the outer circumferential space in the processing container 102 by the force received from the cusp magnetic field M2. Then, cations present in the outer circumferential space in the processing container 102 among the cations in the plasma are attracted to electrons and moved along the facing surface 104a of the dielectric member 104 in the outer circumferential space in the processing container 102. Meanwhile, radicals in the electrically neutral plasma and cations present in the central space in the processing container 102 among the cations in the plasma descend toward the wafer W without receiving a force from the cusp magnetic field M2. Thus, the amount of the cations reaching the wafer W only at the edge portion of the wafer W is suppressed, while the amount of the cations reaching the wafer W at the central portion of the wafer W is maintained. As a result, the ratio of the ions and radicals reaching the wafer W is appropriately controlled.

The description will refer back to FIG. 1. The plasma processing apparatus 100 is connected with the controller (overall control device) 200, and each part of the plasma processing apparatus 100 is controlled by the controller 200. Further, the controller 200 is connected with an operation unit including, for example, a keyboard through which an operator performs an input operation of a command to manage the plasma processing apparatus 100, and a display that visually displays the operation state of the plasma processing apparatus 100.

Further, the controller 200 is connected with a storage unit 220 that stores, for example, a program for implementing various processings performed by the plasma processing apparatus 100 under the control of the controller 200 or recipe data necessary for executing the program.

The storage unit 220 stores, for example, a recipe for performing a necessary processing (e.g., a cleaning processing) in the process container 102, in addition to a plurality of process processing recipes for performing a process processing of the wafer W. The recipes are those obtained by summarizing a plurality of parameter values such as, for example, control parameters for controlling respective parts of the plasma processing apparatus 100 and setting parameters. For example, the process processing recipes have parameter values such as, for example, a processing gas flow rate ratio, a processing container internal pressure, and a high frequency power.

The recipes may be stored in a hard disk or a semiconductor memory, or may be set in a predetermined position of the storage unit 220 while being stored in a storage medium readable by a portable computer such as, for example, a CD-ROM or a DVD.

The controller 200 reads a desired process processing recipe from the storage unit 220 based on, for example, an instruction from the operation unit 210 and controls each part to execute a desired processing in the plasma processing apparatus 100. Further, the recipes may be edited by an operation from the operation unit 210.

The controller 200 switches the magnetic field formed by the electromagnet group 171 to a horizontal magnetic field or a cusp magnetic field by controlling the magnetic poles of the electromagnets 172 of the electromagnet group 171. Specifically, the controller 200 switches the magnetic field formed by the electromagnet group 171 to a horizontal magnetic field or a cusp magnetic field according to the switching timing of the plasma processing performed by the plasma processing apparatus 100. Hereinafter, details of the switching control of the magnetic field by the controller 200 will be described.

For example, it is assumed that the plasma processing apparatus 100 continuously executes a first plasma processing process, a second plasma processing process, and a third plasma processing process. In the first plasma processing process and the third plasma processing process, it is assumed that a desired plasma processing may be performed by keeping the ratio of ions to radicals reaching the wafer W relatively low. Meanwhile, in the second plasma processing process, it is assumed that a desired plasma processing may be performed by keeping the ratio of ions to radicals reaching the wafer W relatively high.

In this case, the controller 200 controls the magnetic poles of the respective electromagnets 172 of the electromagnet group 171 using the "first switching control signal" during the period in which the first plasma processing process is executed, so that the magnetic field formed by the electromagnet group 171 is switched to the horizontal magnetic field. Thus, during the period in which the first plasma processing process is executed, the amount of the cations reaching the wafer W is suppressed in both the central portion and the edge portion of the wafer W. As a result, the ratio of ions to radicals reaching the wafer W is kept relatively low.

Meanwhile, the controller 200 controls the magnetic poles of the respective electromagnets 172 of the electromagnet group 171 using the "second switching control signal" at the timing when the first plasma processing process is switched to the second plasma processing process, so that the magnetic field formed by the electromagnet group 171 is switched to the cusp magnetic field. Thus, during the period in which the second plasma processing process is executed, the amount of the cations reaching the wafer W only at the edge portion of the wafer W is suppressed, while the amount of the cations reaching the wafer W at the central portion of the wafer W is maintained. As a result, the ratio of ions to radicals reaching the wafer W is kept relatively high.

Then, the controller 200 controls the magnetic poles of the respective electromagnets 172 of the electromagnet group 171 using the "first switching control signal" at the timing when the second plasma processing process is switched to the third plasma processing process, so that the magnetic field formed by the electromagnet group 171 is switched back to the horizontal magnetic field. Thus, during the period in which the third plasma processing process is executed, the amount of the cations reaching the wafer W is suppressed in both the central portion and the edge portion of the wafer W. As a result, the ratio of ions to radicals reaching the wafer W is kept relatively low.

Further, the controller 200 may generate a gradient in the magnetic field strength of the magnetic field formed by the electromagnet group 171 by controlling the magnitude of the current flowing through each electromagnet 172 of the electromagnet group 171.

Figure 7:
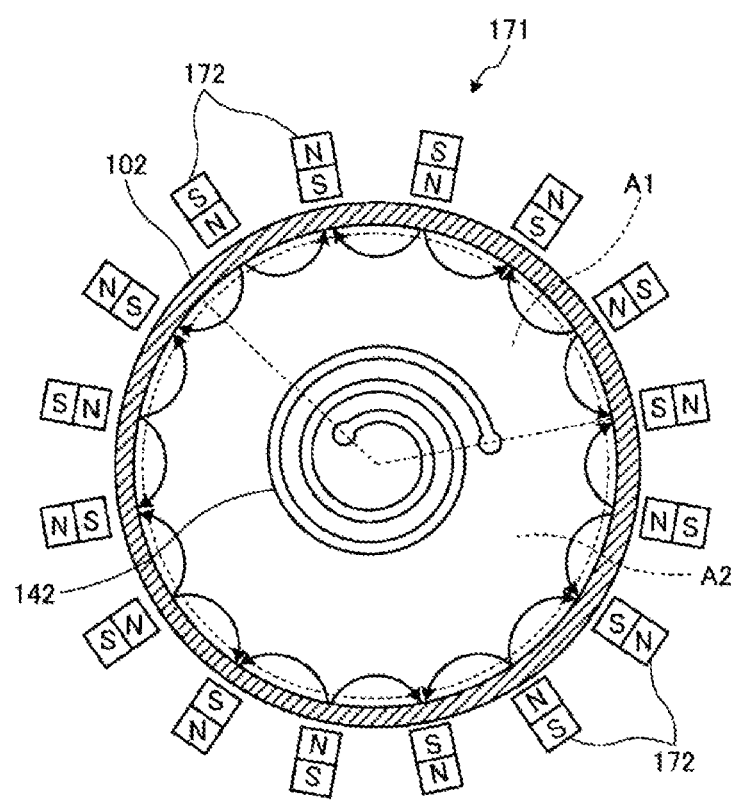
FIG. 7 is a view for explaining a gradient of the magnetic field strength.

FIG. 7 is a view for explaining the gradient of the magnetic field strength. In FIG. 7, it is assumed that the magnetic field formed in the processing container 102 by the electromagnet group 171 is a cusp magnetic field. Since the antenna element 142 of the high frequency antenna 140 is arranged in a spiral shape, the processing container 102 has a space A1 having a relatively large number of spiral portions of the corresponding antenna element 142 and a space A2 having a relatively small number of spiral portions of the corresponding antenna element 142. The number of spiral portions of the antenna element 142 corresponding to the space A1 is three, and the number of spiral portions of the antenna element 142 corresponding to the space A2 is two. The electric field strength of the induced electric field introduced into the processing container 102 from the high frequency antenna 140 varies depending on the number of spiral portions of the antenna element 142. In the example of FIG. 7, since the number of spiral portions of the antenna element 142 corresponding to the space A1 is larger than the number of spiral portions of the antenna element 142 corresponding to the space A2, the electric field strength of the induced electric field introduced into the space A1 becomes larger than the electric field strength of the induced electric field introduced into the space A2. Then, when the electric field strength of the induced electric field varies, the plasma density distribution of the plasma based on the induced electric field introduced into the processing container 102 from the high frequency antenna 140 becomes non-uniform in the processing container 102. In the example of FIG. 7, since the electric field strength of the induced electric field introduced into the space A1 is larger than the electric field strength of the induced electric field introduced into the space A2, the plasma density in the space A1 becomes larger than the plasma density in the space A2.

Therefore, in order to resolve the non-uniformity of the plasma density distribution, the controller 200 generates a gradient in the magnetic field strength of the magnetic field formed by the electromagnet group 171 by controlling the magnitude of the current flowing through each electromagnet 172 of the electromagnet group 171. Specifically, the controller 200 generates a gradient in the magnetic field strength of the magnetic field formed by the electromagnet group 171 such that the magnetic field strength of the magnetic field formed in the space A2 is larger than the magnetic field strength of the magnetic field formed in the space A1. Therefore, the electrons and cations drawn to the space A2 are larger than the electrons and cations drawn to the space A1, and as a result, it is possible to make the plasma density distribution uniform.

As described above, according to the plasma processing apparatus 100 of the exemplary embodiment, since the electromagnet group 171 is disposed along the outer circumference of the processing container 102, it is possible to form a magnetic field in which the ions in the plasma based on the induced electric field introduced from the planar high frequency antenna 140 are moved along the facing surface 104a of the dielectric member 104. Thus, the amount of the cations reaching the wafer W is suppressed. As a result, the ratio of the ions and radicals reaching the wafer W may be appropriately controlled.

Further, according to the plasma processing apparatus 100 of the exemplary embodiment, the magnetic field formed by the electromagnet group 171 is switched to a horizontal magnetic field or a cusp magnetic field according to the switching timing of the plasma processing performed by the plasma processing apparatus 100. Thus, when executing a plurality of plasma processing processes, it is possible to switch the magnetic field formed by the electromagnet group 171 to a magnetic field suitable for each plasma processing process.

Further, according to the plasma processing apparatus 100 of the exemplary embodiment, a gradient is generated in the magnetic field strength of the magnetic field formed by the electromagnet group 171 by controlling the magnitude of the current flowing through each electromagnet 172 of the electromagnet group 171. Thus, it is possible to make the plasma density distribution uniform.

Further, the disclosed technique is not limited to the above-described exemplary embodiment, and various modifications may be made within the scope of the disclosure.

For example, in the above-described exemplary embodiment, the electromagnet group 171 is disposed along the outer circumference of the processing container 102, but the plasma processing apparatus 100 may further include a support member that rotatably supports the electromagnet group 171 around the central axis of the processing container 102. In this case, the controller 200 may further control the support member to rotate the magnetic field formed by the electromagnet group 171 around the central axis of the processing container 102. Thus, it is possible to more efficiently make the plasma density distribution uniform.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus comprising:
a plasma processing container;
a workpiece placement table disposed in the plasma processing container;
a dielectric plate having a facing surface that faces the workpiece placement table;
an antenna provided on a surface of the dielectric plate opposite to the facing surface and configured to introduce an induced electric field for plasma excitation into the plasma processing container via the dielectric plate, the antenna including a planar spiral antenna having spiral portions divided into a first segment and a second segment;
an electromagnet group including a plurality of electromagnets disposed along an outer circumference of the plasma processing container and configured to form a magnetic field in the plasma processing container; and
a controller configured to control magnitudes of electric currents flowing through respective electromagnets of the electromagnet group differently from each other, to generate a magnetic gradient along a circumferential direction in the magnetic field that exists only in an outer circumferential space in the plasma processing container,
wherein:
a first space of the plasma processing container corresponding to the first segment has a greater number of spiral portions of the planar spiral antenna than a second space of the plasma processing container corresponding to the second segment, the controller is configured to generate the magnetic gradient along the circumferential direction in the magnetic field such that a magnetic field strength in the second space is larger than a magnetic field strength in the first space, and the first space is adjacent to the second space in the circumferential direction.

2. The apparatus of claim 1, wherein the controller is configured to control magnitudes of electric currents flowing through respective electromagnets of the electromagnet group differently from each other, to switch the magnetic field that exists only in the outer circumferential space in the plasma processing container, or a horizontal magnetic field that traverses a central space in the plasma processing container and the outer circumferential space surrounding the central space.

3. The apparatus of claim 2, wherein the planar spiral antenna is made of a conductor held by a plurality of holders on the surface of the dielectric plate opposite to the facing surface.

4. The apparatus of claim 1, further comprising:

a support configured to rotatably support the electromagnet group about a central axis of the plasma processing container, wherein the controller controls the support to rotate the magnetic field formed by the electromagnet group about the central axis of the plasma processing container.

5. The apparatus of claim 4, wherein the planar spiral antenna is made of a conductor held by a plurality of holding members on the surface of the dielectric plate opposite to the facing surface.

6. The apparatus of claim 1, wherein the number of electromagnets disposed adjacent to the second space is greater than the number of electromagnets disposed adjacent to the first space.

7. The apparatus of claim 1, wherein the second space is greater than the first space.

* * * * *